United States Patent
Gau et al.

(10) Patent No.: US 6,877,152 B2
(45) Date of Patent: Apr. 5, 2005

(54) METHOD OF INTER-FIELD CRITICAL DIMENSION CONTROL

(75) Inventors: Tsai-Sheng Gau, Hsin-Chu (TW); Anthony Yen, Austin, TX (US); Burn J. Lin, Hsinchu (TW)

(73) Assignee: Taiwan Semiconductor Manufacturing Company, Hsinchu (TW)

( * ) Notice: Subject to any disclaimer, the term of this patent is extended or adjusted under 35 U.S.C. 154(b) by 97 days.

(21) Appl. No.: 10/402,579

(22) Filed: Mar. 28, 2003

(65) Prior Publication Data

US 2003/0215964 A1 Nov. 20, 2003

(30) Foreign Application Priority Data

Mar. 29, 2002 (TW) ........................................ 91106423 A

(51) Int. Cl.⁷ .............................................. G06F 17/50
(52) U.S. Cl. .......................................... 716/21; 716/19
(58) Field of Search ..................................... 716/21, 19

(56) References Cited

U.S. PATENT DOCUMENTS

| | | | | |
|---|---|---|---|---|
| 5,646,870 A | * | 7/1997 | Krivokapic et al. | 716/4 |
| 6,699,627 B2 | * | 3/2004 | Smith et al. | 430/22 |
| 2002/0072001 A1 | * | 6/2002 | Brown et al. | 430/30 |
| 2002/0093648 A1 | * | 7/2002 | Nikoonahad et al. | 356/237.1 |

OTHER PUBLICATIONS

Papoulis, "Probability, Random Variables, and Stochastic Processes", McGraw–Hill Inc, 1965, pp. 144.*

* cited by examiner

Primary Examiner—Vuthe Siek
Assistant Examiner—Sun James Lin
(74) Attorney, Agent, or Firm—Thomas, Kayden, Horstemeyer & Risley

(57) ABSTRACT

A method of inter-field critical dimension control. The method is applied to a wafer with a plurality of dies manufactured by a wafer manufacturing process that includes exposure. According to the method, a plurality of manufacturing modules is obtained by selecting a manufacturing device for each process of the manufacture. Then, for each manufacturing module, exposure is performed with a predetermined exposure energy to obtain critical dimension distribution data corresponding to the predetermined exposure energy, and critical dimension calibration data for each of the dies is further determined. Thus, when one of the manufacturing modules is applied to perform the manufacture, an exposure energy for each of the dies is determined according to the predetermined exposure energy and the critical dimension calibration data for each of the dies, and the manufacture is performed with the exposure energy on each of the dies for the manufacturing module.

11 Claims, 4 Drawing Sheets

METHOD OF INTER-FIELD CRITICAL DIMENSION CONTROL

BACKGROUND OF THE INVENTION

1. Field of the Invention

The present invention relates to a method of critical dimension control, and particularly to a method of inter-field critical dimension control for a wafer in semiconductor technique.

2. Description of the Related Art

A critical dimension (CD) of a circuit is commonly defined as the smallest width of a line or the smallest space between two lines. Generally, the critical dimension is an important factor for the wafer manufacturing process. FIG. 1 shows a scheme of a wafer 100, which has a plurality of dies (or fields) 10. Generally, control of the critical dimension of the wafer 100 includes intra-field CD control and inter-field (or die-to-die) CD control. The intra-field CD control refers to control of the critical dimension in a individual die 10, so that the line width in the individual die 10 has approximately the same value. Meanwhile, the inter-field CD control refers to control of the critical dimension between the dies 10, so that the line width has approximately the same value among the dies 10.

When the inter-field critical dimension control applied to the wafer 100 is not preferred, the line width among the dies 10 of the wafer 100 varies. This reduces the stability of the semiconductor chips obtained by the dies 10. Consequently, the inter-field critical dimension control relates to the consistence of the die quality on the wafer.

Wafer manufacturing includes a plurality of individual processes, such as deposition, coating, exposure, developing, baking, and etching. An example of the wafer manufacturing process is described with reference to FIG. 2. In FIG. 2, the wafer 100 is sent into the film deposition chamber 20 for film deposition and moved to the bottom anti-resist coating (BARC) layer chamber 30 for bottom anti-resist coating. Then, the wafer 100 is moved sequentially to the resist coating chamber 40, the soft baking hot plate 50, the stepper 60, the hard baking hot plate 70 and the developing chamber 80 for resist coating, soft baking, exposure, hard baking, and developing. Finally, the wafer 100 is obtained by performing resist etching in the etching chamber 90 to finish the wafer manufacturing process.

In the above-mentioned process, any of the individual process can affect the inter-field critical dimension of the wafer. For example, uniformity of the resist coating layer determines the line width uniformity among the dies, and temperature difference during baking can affect the line width on the wafer at a rate of approximately 6 to 10 nm/° C.

In conventional critical dimension control, a plurality of experiments analyze each individual process in the above-mentioned wafer manufacturing process, so that a critical process has been obtained to perform calibration to improve the critical dimension control.

For example, U.S. Pat. No. 5,926,690 disclosed a run-to-run control process for the critical dimension control. The process employs a control system using photoresist etching time as a controlling variable in either a feedforward or a feedback control configuration to control critical dimension variation during semiconductor fabrication.

Another conventional example is disclosed in U.S. Pat. No. 6,063,530, where a method of critical dimension control through measurement of absorbed radiation is disclosed. In this prior art, a lithographic system with a detector for determining the amount of energy absorbed by the photoresist is applied. This enables the lithographic system to expose each field with the required exposure dose, thus reducing variations in the critical dimension.

Further, U.S. Pat. No. 6,529,623 disclosed a technique of stepper lens specific reticle compensation for the critical dimension control. In this prior art, the reticle is modified to produce an error which is selected to cancel the error that is being produced by the lens aberration so as to obviate the problem in which localized lens aberration causes a pattern of low yield which cannot be corrected by conventional stepper correction/adjustment and which leads to the determination that the stepper lens is the source of the problem. The modified reticle is then dedicated to the particular stepper.

Another conventional example is disclosed in U.S. Pat. No. 6,528,331, where a method for identifying and controlling impact of ambient conditions on the photolithography processes is disclosed. The method in this prior art includes the steps of: identifying a disturbance in a photolithographic process arising from an ambient condition; modeling the identified disturbance; and applying the model to modify a control input parameter. Since potential disturbances may be identified by characteristic data patterns or may be identified as known consequences to modifications to the critical dimension control, the model obtained in this method describes how the change in the critical dimension control affects the overlay performance.

However, in the above-mentioned prior arts, it should be mentioned that the apparatus used in the wafer manufacturing process generally includes a plurality of manufacturing devices for an individual process. In FIG. 2, for example, the film deposition chamber 20 includes three chambers DP1, DP2 and DP3; the BARC chamber 30 includes two chambers BARC1 and BARC2; the resist coating chamber 40 includes two chambers RC1 and RC2; the soft baking hot plate 50 includes three plates SHP1, SHP2 and SHP3; the stepper 60 for exposure includes three steppers STP1, STP2 and STP3; the hard baking hot plate 70 includes three plates HHP1, HHP2 and HHP3; the developing chamber 80 has two chambers DVP1 and DVP2; and etching is performed in two etching chambers, ETCH1 and ETCH2.

It is obvious that a difference exists among manufacturing devices for each of the individual process and the difference may affect the critical dimension control in the wafer manufacturing process. Further, it is difficult to find a critical process for wafer manufacture since each of the individual process may use different manufacturing devices. In FIG. 2, by combination of the manufacturing devices for the whole wafer manufacturing process, a group of 1296 manufacturing modules is obtained. Consequently, it is not possible to improve the inter-field critical dimension by calibration of any individual process.

SUMMARY OF THE INVENTION

In view of this, the present invention relates to a method of inter-field critical dimension control for a wafer with a plurality of dies manufactured by exposure. The exposure energy of exposure is calibrated to compensate for the inter-field critical dimension difference due to the whole wafer manufacturing process. Thus, there is no need to determine a critical individual process in the wafer manufacturing process, and the inter-field critical dimension control is effective and simplified.

The present invention discloses a method of inter-field critical dimension control for a wafer with a plurality of dies manufactured by exposure. The method comprises performing exposure with a predetermined exposure energy for obtaining critical dimension distribution data for the dies corresponding to the predetermined exposure energy, determining critical dimension calibration data for each of the dies according to the critical dimension distribution data for the dies, determining an exposure energy for each of the dies according to the predetermined exposure energy and the critical dimension calibration data for each of the dies, and performing exposure with the exposure energy on each of the dies.

Further, the present invention discloses a method of inter-field critical dimension control for a wafer with a plurality of dies manufactured by exposure. The method comprises obtaining a plurality of manufacturing modules by selecting a manufacturing device for each manufacturing process of the wafer, performing exposure for each of the manufacturing modules with a predetermined exposure energy for obtaining critical dimension distribution data for the dies corresponding to the predetermined exposure energy, determining critical dimension calibration data for each of the dies according to the critical dimension distribution data for the dies for each of the manufacturing modules, determining an exposure energy for each of the dies when one of the manufacturing modules is applied to perform the wafer manufacturing process according to the predetermined exposure energy for the manufacturing module and the critical dimension calibration data for each of the dies for the manufacturing module, and manufacturing the wafer with the exposure energy on each of the dies for the manufacturing module, and performing the exposure using the exposure energy for each of the dies.

It should be mentioned that the manufacturing process of the wafer includes the exposure. Further, the manufacturing process of the wafer generally includes a film deposition process, a coating process, a developing process, a baking process, and an etching process.

In the method of the present invention, the critical dimension calibration data can be determined by calculating an exposure value for each of the dies according to the critical dimension distribution data for the dies, and determining the critical dimension calibration data for each of the dies according to the exposure value for each of the dies and an average value of the critical dimension relative values of the dies.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 3:
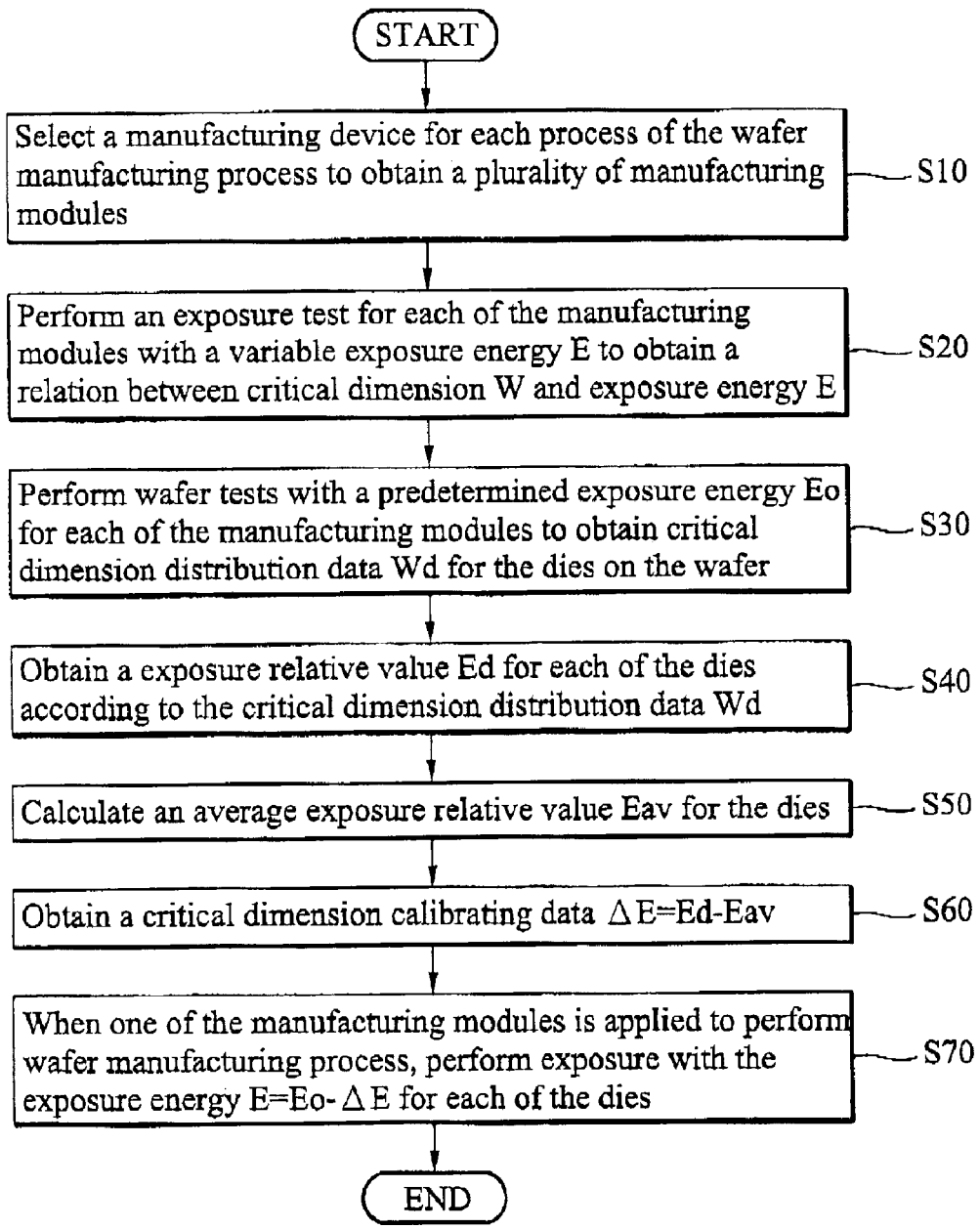
FIG. 3 is a flow chart showing the method of inter-field critical dimension control of the present invention.

The method of inter-field critical dimension control of the present invention can be hereinafter described with reference to FIG. 3. The method of inter-field critical dimension control of the present invention is applied to a wafer with a plurality of dies. The wafer manufacturing process has an exposure process.

Figure 1:
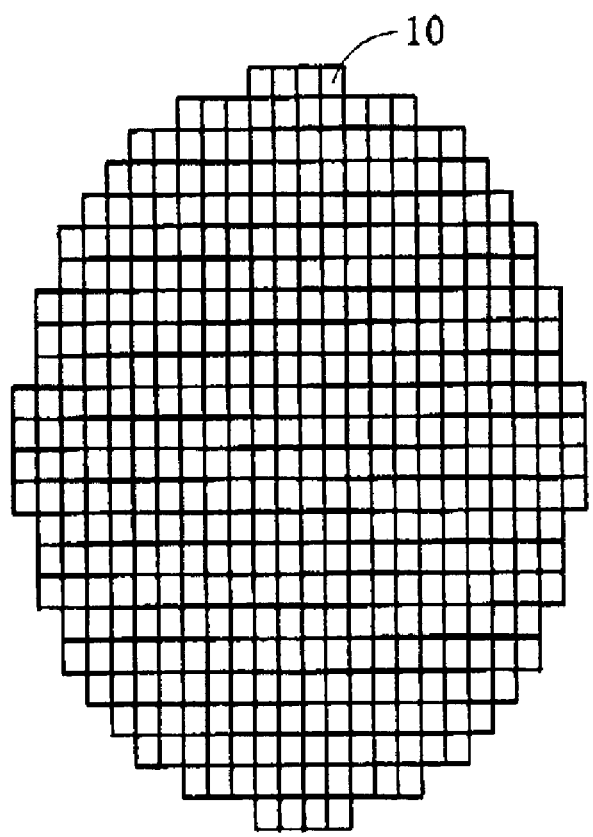
FIG. 1 is a schematic view of a wafer.
Figure 2:
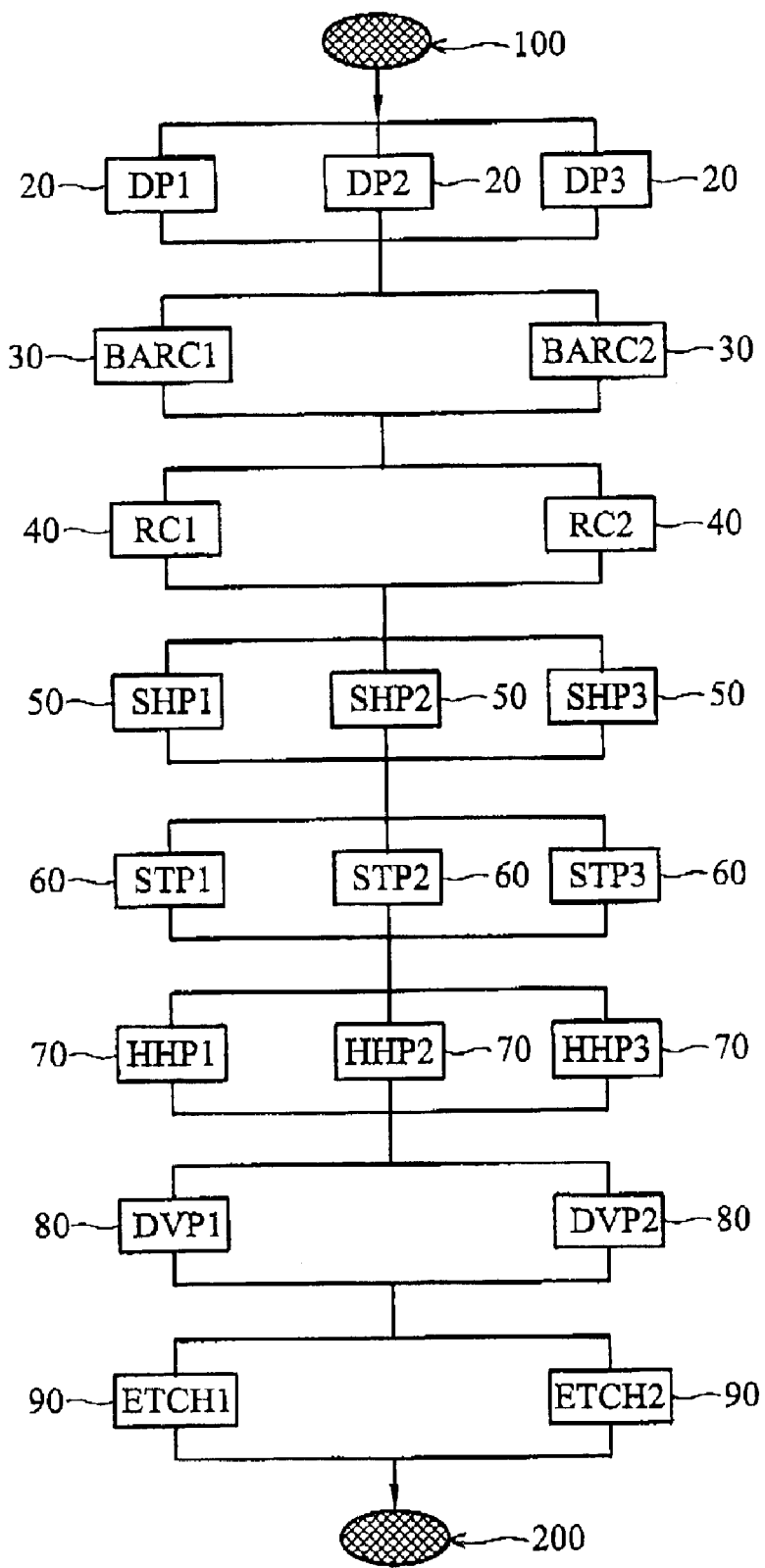
FIG. 2 is a schematic view showing a plurality of manufacturing modules of the wafer manufacturing process.

First, before an experiment for the wafer manufacturing process begins, it is necessary to select a manufacturing device for each process of the wafer manufacturing process to obtain a plurality of manufacturing modules (step S10), such as the 1296 manufacturing modules in FIG. 2. It should be noted that in practical industrial application, not all of the 1296 manufacturing modules are generally applied in the wafer manufacturing process. In some cases, it is possible that only one of the manufacturing modules, such as a manufacturing module shown as DP1-BARC1-RC1-SHP1-STP1-HHP1-DVP1-ETCH1 in FIG. 2, is applied to perform all the wafer manufacturing process. Consequently, the following steps of the method are preferably performed only on manufacturing modules applied to the wafer manufacturing process.

Once the manufacturing modules are obtained, an experimental exposure test for each of the manufacturing modules is performed on the wafer 100 with a variable exposure energy E, so that the relationship between critical dimension W of the wafer 100 and the exposure energy E is obtained (step S20). This relationship is described later.

Then, a plurality of wafer tests for each of the manufacturing modules is performed, in which exposure for each of the manufacturing modules is performed with a predetermined exposure energy Eo. Thus, with various wafer tests, an average value of the critical dimension distribution data Wd for the dies 10 on the wafer 100 is obtained (step S30). Since differences exist between the manufacturing modules, the critical dimension distribution data Wd for the dies 10 may vary.

Then, with the relationship between the critical dimension W of the wafer 100 and the exposure energy E as described in step S20, an exposure value Ed for each of the dies 10 is obtained according to the critical dimension distribution data Wd of the dies (step S40), and an average exposure value Eav of the exposure values Ed for the dies 10 is calculated (step S50). Thus, critical dimension calibration data ΔE for each of the dies 10 is obtained as the difference of the exposure value Ed for each of the dies 10 and the average exposure value Eav. That is, ΔE=Ed−Eav (step S60).

Finally, when one of the manufacturing modules, such as the manufacturing module DP1-BARC1-RC1-SHP1-STP1-HHP1-DVP1-ETCH1 in FIG. 2, is applied to perform the wafer manufacturing process, exposure can be performed with an exposure energy E for each of the dies 10 determined by the critical dimension calibration data ΔE for each of the dies 10 and the predetermined exposure energy Eo. In this case, E=Eo−ΔE (step S70). Thus, the exposure can be performed using the exposure energy for each of the dies, and the inter-field critical dimension of the wafer 100 can be improved.

The relationship between the critical dimension W of the wafer 100 and the exposure energy E is hereinafter described with reference to the diagram of FIG. 4.

Generally, the line width of the critical dimension W is approximately in inverse proportion to the exposure energy E. In FIG. 4, the relationship between the critical dimension W of the wafer 100 and the exposure energy E is shown in the form of a function of W=F(E).

The function F is determined by the difficulty of the wafer manufacturing process. Further, the function F should be a function of all imaging and processing conditions. It should be easily derived from experimental or simulation results, and should be sensitive to changes. An equation for the wafer manufacturing process applied is derived as:

$$P = k1 \times (\lambda/NA) \qquad (1)$$

where P is a minimum pitch of the line width of the critical dimension W, $\lambda$ is the wavelength of the incident light applied in exposure, NA is a numerical aperture of the lens applied in exposure, and k1 is a constant relative set by the user according to the difficulty of the wafer manufacturing process.

When the minimum pitch P is fixed, a large constant k1 induces a short wavelength $\lambda$ of the incident light or a large numerical aperture NA, which reduces the difficulty of the wafer manufacturing process. In contrast, a small constant k1 refers to a difficult wafer manufacturing process.

Two functions for the relationship between the critical dimension W of the wafer 100 and the exposure energy E were obtained by experiment. When k1 is large, $$W = (1/\eta_{ref}) \log E \qquad (2)$$

and when k1 is small, $$W = (1/\beta) \log(10 \times \log E) \qquad (3)$$

where $\eta_{ref}$ and $\beta$ are constants.

Figure 4:
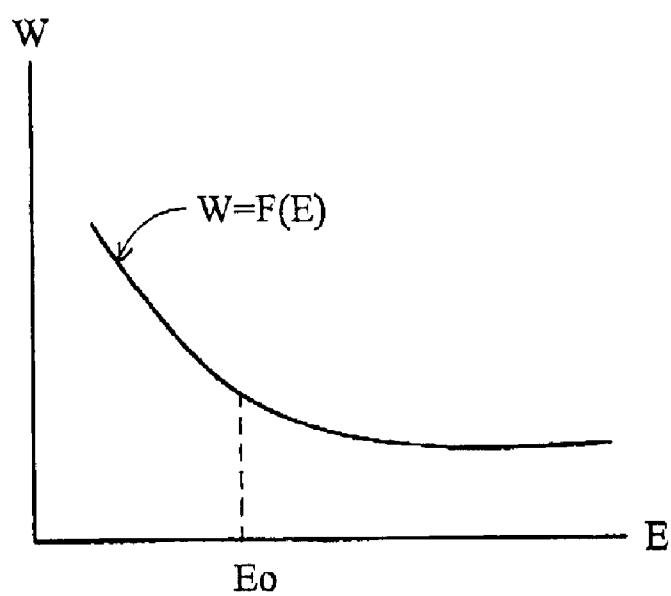
FIG. 4 is a diagram showing an embodiment of the relationship between the critical dimension and the exposure energy of the present invention.

Consequently, the two functions (2) or (3) can be selectively applied in step S20 according to the constant k1 to obtain a diagram of FIG. 4. Thus, the critical dimension W can be determined by the relation according to the selected function.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of inter-field critical dimension control for a wafer with a plurality of dies manufactured by exposure, the method comprising:

performing exposure with a predetermined exposure energy for obtaining critical dimension distribution data for the dies corresponding to the predetermined exposure energy;

determining an exposure value (E) for each of the dies according to the critical dimension distribution data (W) for the dies, wherein $W = (1/\eta_{ref}) \log E$, where $\eta_{ref}$ is a constant;

determining the critical dimension calibration data for each of the dies according to the exposure value for each of the dies and an average value of critical dimension relative values of the dies; and determining an exposure energy for each of the dies according to the predetermined exposure energy and the critical dimension calibration data for each of the dies and performing exposure with the exposure energy on each of the dies.

2. The method of inter-field critical dimension control according to claim 1, wherein the critical dimension distribution data W and the exposure value E for each of the dies have a relationship of:

$$W = (1/\beta) \log(10 \times \log E)$$

where $\beta$ is a constant.

3. A method of inter-field critical dimension control for a wafer with a plurality of dies manufactured by exposure, comprising:

obtaining a plurality of manufacturing modules by selecting a manufacturing device for each manufacturing process of the wafer, wherein the manufacturing process comprises the exposure;

performing exposure for each of the manufacturing modules with a predetermined exposure energy for obtaining critical dimension distribution data for the dies corresponding to the predetermined exposure energy;

calculating an exposure value (E) for each of the dies according to the critical dimension distribution data (W) for the dies, wherein $W = (1/\eta_{ref}) \log E$, where $\eta_{ref}$ is a constant;

calculating the critical dimension calibration data for each of the dies according to the exposure value for each of the dies and an average value of the critical dimension relative values of the dies;

determining an exposure energy for each of the dies when one of the manufacturing modules is applied to perform the wafer manufacturing process according to the predetermined exposure energy for the manufacturing module and the critical dimension calibration data for each of the dies for the manufacturing module, and manufacturing the wafer with the exposure energy on each of the dies for the manufacturing module; and performing the exposure using the exposure energy for each of the dies.

4. The method of inter-field critical dimension control according to claim 3, wherein the critical dimension distribution data W and the exposure value E for each of the dies have a relationship of:

$$W = (1/\beta) \log(10 \times \log E)$$

where $\beta$ is a constant.

5. The method of inter-field critical dimension control according to claim 3, wherein the manufacturing process of the wafer comprises a film deposition process.

6. The method of inter-field critical dimension control according to claim 3, wherein the manufacturing process of the wafer comprises a coating process.

7. The method of inter-field critical dimension control according to claim 3, wherein the manufacturing process of the wafer comprises a developing process.

8. The method of inter-field critical dimension control according to claim 3, wherein the manufacturing process of the wafer comprises a baking process.

9. The method of inter-field critical dimension control according to claim 3, wherein the manufacturing process of the wafer comprises an etching process.

10. A method of inter-field critical dimension control for a wafer with a plurality of dies manufactured by exposure, comprising:

obtaining a plurality of manufacturing modules by selecting a manufacturing device for each manufacturing process of the wafer, wherein the manufacturing process comprises a film deposition process, a coating process, the exposure, a developing process, a baking process, and an etching process;

performing exposure for each of the manufacturing modules with a predetermined exposure energy for obtaining critical dimension distribution data for the dies corresponding to the predetermined exposure energy;

calculating an exposure value (E) for each of the dies according to the critical dimension distribution data (W) for the dies, wherein $W=(1/\eta_{ref})\log E$, where $\eta_{ref}$ is a constant;

determining critical dimension calibration data for each of the dies according to the exposure value for each of the dies and an average value of the critical dimension relative values of the dies;

determining an exposure energy for each of the dies when one of the manufacturing modules is applied to perform the wafer manufacturing process according to the pre-determined exposure energy for the manufacturing module and the critical dimension calibration data for each of the dies for the manufacturing module, and manufacturing the wafer with the exposure energy on each of the dies for the manufacturing module; and performing the exposure using the exposure energy for each of the dies.

11. The method of inter-field critical dimension control according to claim 10, wherein the critical dimension distribution data W and the exposure value E for each of the dies have a relationship of:

$$W=(1\beta)\log(10\times\log E)$$

where $\beta$ is a constant.

* * * * *